United States Patent [19]

Lee et al.

[11] Patent Number: 5,781,485
[45] Date of Patent: Jul. 14, 1998

[54] APPARATUS AND METHOD FOR CONTROLLING OPERATING MODE IN SEMICONDUCTOR MEMORY DEVICE

[75] Inventors: Ki-Jun Lee; Jin-Ki Kim, both of Seoul, Rep. of Korea

[73] Assignee: Samsung Electronics Co., Ltd., Rep. of Korea

[21] Appl. No.: 563,404

[22] Filed: Nov. 30, 1995

[30] Foreign Application Priority Data

Nov. 30, 1994 [KR] Rep. of Korea ............... 1994-32089

[51] Int. Cl.$^6$ ................................................. G11C 13/00
[52] U.S. Cl. ............................... 365/201; 365/189.01
[58] Field of Search ........................ 365/189.01, 189.04, 365/189.05, 189.07, 230.01, 201

[56] References Cited

U.S. PATENT DOCUMENTS

| 4,428,068 | 1/1984 | Baba ............................. 365/201 |
| 4,903,236 | 2/1990 | Nakayama et al. ............. 365/189.01 |
| 5,235,549 | 8/1993 | Young et al. ................... 365/201 |

*Primary Examiner*—Terrell W. Fears
*Attorney, Agent, or Firm*—Cushman, Darby & Cushman IP Group of Pillsbury Madison & Sutro, LLP

[57] ABSTRACT

An apparatus and method for controlling an operating mode in a semiconductor memory device is provided. During test mode, test mode selection signals are supplied to the memory device according to test mode commands received from an external pad and decoded internally. During both test mode and user mode, user mode selection signals are supplied to the memory device according to user mode commands received from an external pad and decoded internally. Upon receipt of a test release command, test mode commands are fusably disabled, such that entry into test mode and decoding of test mode commands is thereafter prevented.

16 Claims, 5 Drawing Sheets

APPARATUS AND METHOD FOR CONTROLLING OPERATING MODE IN SEMICONDUCTOR MEMORY DEVICE

BACKGROUND OF THE INVENTION

The present invention relates to an apparatus and method for controlling an operating mode in a semiconductor memory device, and more particularly to a control apparatus and method capable of preventing a user from entering any other operating mode except a user mode.

In general, semiconductor memory devices have two operating modes, a user mode and a test mode. The user mode includes data operations such as read, write, and erase. An EEPROM, for example, includes user mode operations such as data load, program, chip erase, program verify, erase verify, status read, etc. The data operations do not affect the feature of the chip. On the other hand, the test mode operations do affect the chip to some degree. In an EEPROM, for example, there are test mode operations such as redundant repair, stress test, leakage test, program margin test, and chip program test, etc. These operations can have a fatal effect on a chip if performed unwittingly by a user because the test mode is not intended to be used by an ordinary user.

Therefore, there is needed in the art a way to prevent the ordinary user from using the test mode. Two methods are known in the prior art. One is to use a high voltage when performing the test mode and the other is to enter the test mode through a latch method after asserting the high voltage.

Figure 1:
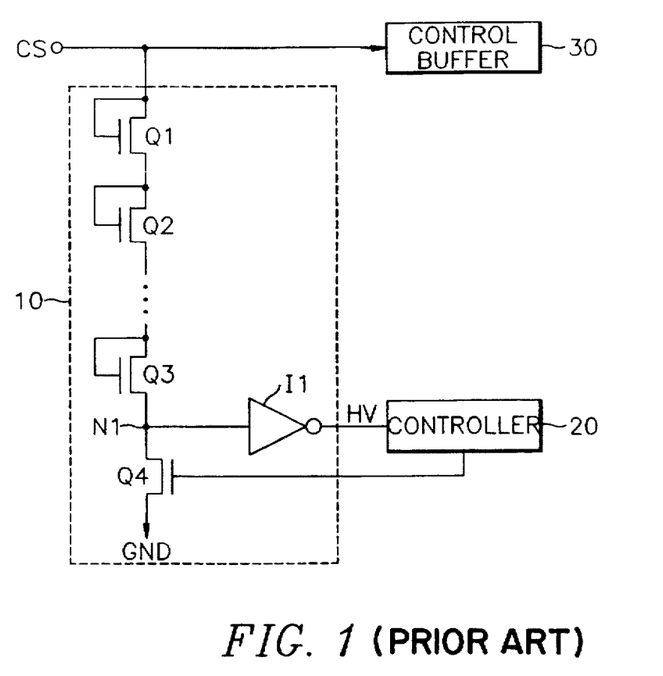
FIG. 1 is a diagram illustrating a first method for controlling the performance of a test mode according to the conventional semiconductor memory device.

FIG. 1 is a circuit diagram showing an embodiment for controlling entry into a test mode according to the first conventional method. In this embodiment, a detector 10 comprises NMOS transistors Q1–Q3 connected in series between an input terminal CS and a node N1 in a diode type arrangement; an NMOS transistor Q4 is connected between the node N1 and the ground voltage and has a gate electrode connected to an output signal of a controller 20; and an inverter I1 is connected between the node N1 and the controller 20. The NMOS transistors Q1–Q3 may be constructed with multiple terminals, even though only three are shown in this embodiment. Also, the NMOS transistors Q1–Q3 have a predetermined channel resistance. During the test mode a high voltage is applied to the input terminal CS, whereas during a normal mode, the power supply voltage having a level of an operating voltage is applied. When an operating power voltage level is applied to the input terminal CS during the normal mode, the node N1 has a low voltage level due to the channel resistance of the NMOS transistors Q1–Q3. Therefore, the inverter I1 generates a logic "high" signal and then applied the signal to the controller 20. The controller 20 thereby determines that a normal operating has been selected. However, when a high voltage is applied to the input terminal CS, the potential of the N1 rises above the threshold required by the inverter I1, such that the inverter I1 generates a high voltage detection signal HV having a logic "low" level. The controller 20 then senses the test mode selection in the high voltage detection signal HV and places the device in test mode.

In this conventional method, since the controller 20 controls entry into test mode by monitoring the high voltage detection signal HV, high voltages must continuously be provided while performing test mode operations. Moreover, in the above test mode control method, the following problems arise. First variations in the manufacture of the NMOS transistors Q1–Q3 can change the high voltage detection level of detector 10, such that the high voltage detection signal HV is undesirably generated even in the user mode. Secondly, the trip voltage of inverter I1 can become low when the power supply voltage fluctuates lower, causing a false HV detection signal to be generated. Thirdly, the bias voltage applied to the input terminal CS must be adjusted when chip features are tested with respect to variations in power supply voltage. Accordingly, when performing the test mode using a high power supply voltage, an even higher voltage must be provided to the input terminal CS in order to enter the test mode. Therefore, it is difficult to test chip features and easy to damage the chip under high voltage conditions. Fourthly, and finally, since the high voltage must constantly be applied during test mode, the number of test modes is limited because damage to the chip is increasingly likely due to the stress added thereto by each test.

Figure 2:
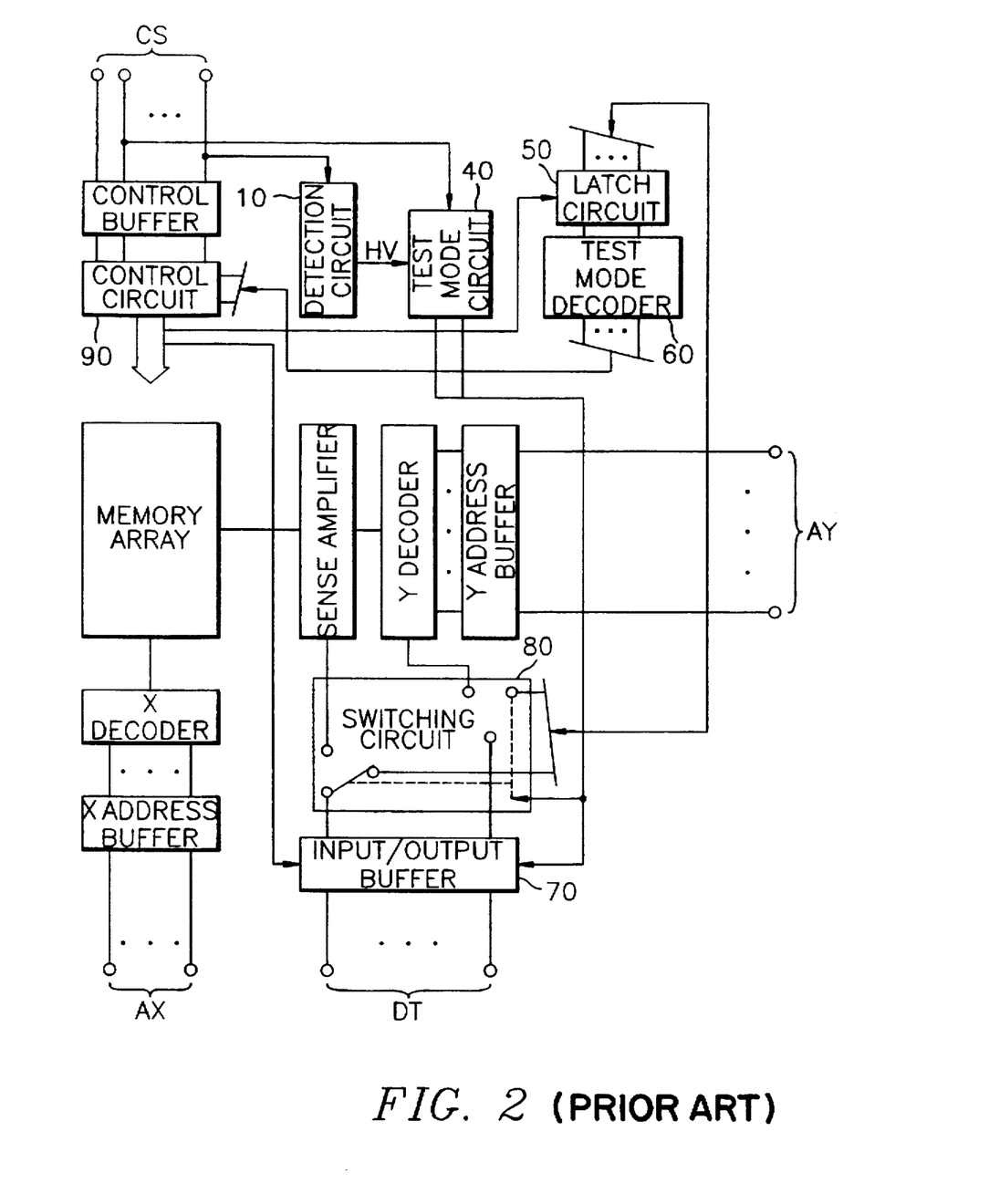
FIG. 2 is a diagram illustrating a second method for controlling the performance of a test mode according to the conventional semiconductor memory device.

To solve such problems, U.S. Pat. No. 4,970,727 invented by Miyawaki, illustrated in FIG. 2, provides a method for controlling the test mode without the need for continuously providing the high voltage. In this method, when a test mode signal having a high level is applied to the input terminal CS, the detector 10 generates the high voltage detection signal HV in the same manner as described above. The high voltage detection signal HV is then provided to a test mode circuit 40, which controls a switching circuit 80 to latch a test code outputted from input/output buffer 70 in latching circuit 50. The test code stored in the latching circuit 50 is then provided to a test mode decoder 60 and decoded. When controller 90 receives a test decoding signal, the corresponding test mode is performed.

As is apparent, this method has the advantage that high voltage does not need to be continuously applied during performance of a test mode. However, since the same high voltage detection 10 is used to latch the test code, there arise the same high voltage problems as described in the first, second and third points above. Accordingly, should a user accidentally or unknowingly choose a test mode or a specific operating mode intended to be used only when manufacturing the chip (for instance, a redundant repair mode), a chip defect can be caused.

SUMMARY OF THE INVENTION

Accordingly, it is an object of the present invention to provide an apparatus and method for controlling an operating mode in a semiconductor memory device so as to prevent a user from entering any other operating mode except a user mode.

Another object of the present invention is to provide an apparatus and method capable of providing a stable operating mode by blocking entry into a test mode during a user mode in a semiconductor memory device having both user and test modes.

It is yet another object of the invention to provide an apparatus and method for performing a test mode operation through an input command decoded by a test mode decoder during the test mode, while preventing the prosecution of a test mode command during a user mode by providing a plurality of mode decoders such that the test mode decoder can be disabled after a test release mode is performed.

To achieve these objects, an apparatus and method for controlling an operating mode in a semiconductor memory device is provided wherein during test mode, test mode selection signals are supplied to the memory device according to test mode commands received from an external pad and decoded internally by test mode decoders. During both test mode and user mode, user mode selection signals are supplied to the memory device according to user mode commands received from an external pad and decoded internally by user mode decoders. Upon receipt of a test release command, test mode commands are fusably disabled, such that entry into test mode and decoding of test mode commands is thereafter prevented.

BRIEF DESCRIPTION OF THE DRAWINGS

The above and other objects, advantages and features if the present invention will be more apparent from the following detailed description taken with reference to the attached drawings in which.

DETAILED DESCRIPTION OF THE PREFERRED EMBODIMENT

The term "user mode selection signal UMS" as mentioned in the present invention indicates a signal for presenting a user mode command decoded in a user mode decoder 500 after receiving a command for performing the user mode operation. The term "test mode selection signal TMS" as mentioned in the present invention indicates a signal for presenting a test mode command decoded in a test mode decoder 200 after receiving a command for performing the test mode operation. The term "test mode release signal TMD" indicates a signal decoded in the test mode release decoder after receiving a test release command upon completing a test function in the test mode. Finally, the term "test control signal DIST" indicates a signal by which the test mode decoder 200 is deactivated upon receipt of the test mode release signal TMD.

Figure 3:
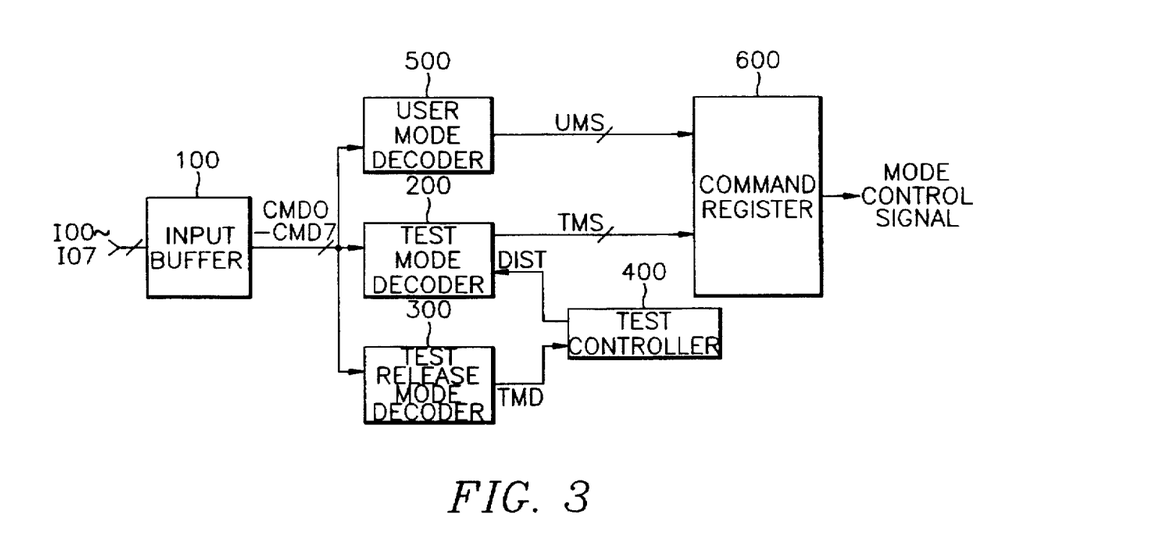
FIG. 3 is a block diagram illustrating an apparatus for controlling the operating mode of a semiconductor memory device according to the present invention.

FIG. 3 is a diagram illustrating an apparatus for controlling an operating mode in the semiconductor memory device according to the present invention. An input buffer 100 of FIG. 3 generates data inputted from an external pad as command data CMD. The command data CMD consists of a plurality of bits. It is assumed that command data CMD of 8 bits is used in the present invention. The user mode decoder 500 is comprised with the same number of user decoders as the number of user modes capable of being performed in the semiconductor memory device. The user mode decoder 500 decodes the command data CMD, and in case the user command is received, it enables a corresponding user decoder to thereby generate the appropriate user mode decoding signal UMS. Likewise, the test mode decoder 200 is comprised of the same number of test decoders as the number of test modes capable of being performed in the semiconductor memory device and its operation is activated or deactivated by a test ending signal DIST. The test mode decoder 200 decodes the command data CMD during the test mode, and when a test command is received, it enables a corresponding test decoder to thereby generate the appropriate test mode decoding signal TMS. The test mode release decoder 300 generates the test mode release signal TMD by decoding the test release command from the received command data CMD. The test mode controller 400, which internally comprises a switching element, receives an output of the test mode release decoder 300 and generates the test ending signal DIST under a switching operation of the switching element when the test mode release signal TMD is inputted from the test mode release decoder 300. Moreover, by operation of the switching elements once the test ending signal DIST is generated, it is continuously maintained in its initial state. Thereafter, the test ending signal is applied to the test mode decoder 200 to permanently deactivate the test mode decoder 200. A command register 600 receives the user mode selection signal UMS from the user mode decoder 500 and also receives the test mode selection signal TMS from the test mode decoder 200 command register 600 stress the received selection signal, then outputs a control signal to perform the corresponding mode operation. Assuming command data of 8 bits, it is possible to perform 255 kinds of test modes and user modes.

Operations of FIG. 3 may be classified into three types: test mode, test release mode, and user mode. Test mode operations are analyzed by the test mode decoder 200. Test mode decoder 200 is controlled according to the logic level of the test ending signal DIST outputted from test mode controller 400. If the test ending signal DIST is not generated, the test mode decoder 200 decodes the received test command data CMD and generates the test mode selection signal TMS for performing a corresponding test mode. The test mode decoder 200 is comprised with the same number of test decoders as the number of test modes capable of being performed. Also, the command data of each test mode has different values. If the test ending signal DIST is not generated, the test mode decoder 200 is an enabled state. In such a state the test mode decoder 200 receives command data CMD outputted from the input buffer 100 and generates the test mode selection signal TMSj for performing the corresponding test mode by operation of the test decoder associated with the received test command.

Figure 4:
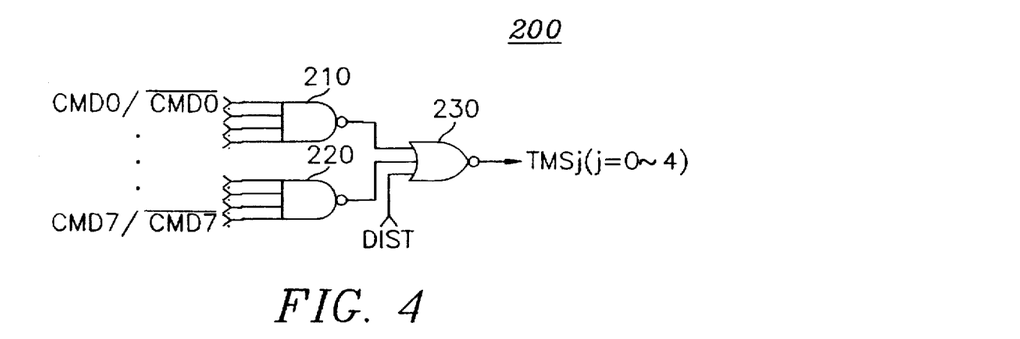
FIG. 4 is a circuit diagram illustrating one test mode decoder among that shown in FIG. 3.

FIG. 4 is a diagram illustrating one test decoder in the test mode decoder 200. The input buffer 100 outputs the command data CMD having 8 bits. NAND gates 210 and 220 of 4 bits each are used as decoders and have input terminals configured for performing the specific test mode. The test decoder shown in FIG. 4 is associated with the selected test mode and has its input terminal configured to respond to the corresponding received test command data CMD. For example, assume a test mode 1 is selected through a command data represented by the bit expression 0000 0001, corresponding to bits CMD7 to CMD0, respectively. Accordingly, an associated test decoder for test mode 1 would be configured to respond to CMD7 to CMD1 and CMD0. Meantime, it is assumed that five test modes TMS0–TSM4 can be performed in the present invention.

The NAND gates 210 and 220 each output signals set to the logic "low" level when the specific command data CMD of 4 bits for each gate in the test decoder. A NOR gate 230 inputs the signals output from NAND gates 210 and 220 and the test ending signal DIST. At present, the test ending signal DIST has a logic "low" level during the test mode. If the test mode is released, the signal DIST is changed to the logic "high" level. Accordingly, when the command of the specific test mode for the decoder is received and the test mode is thus enabled, the NOR gate 230 inputs three signals set to the logic "low" level and thereby generates a signal set to the logic "high" level. The generated signals correspond to test mode selection signals TMSj (j=0–4) used when the specific test decoder enables the corresponding test mode. However, if the test ending signal DIST is inputted at the logic "high" level or if the specific command data CMD of the decoder of FIG. 4 is not received, the NOR gate 230 outputs a signal set to the logic "low" level and the test mode is thus deactivated.

When the test mode is performed in the above manner, if the input buffer 100 outputs the command data CMD for releasing the test mode, the test mode release decoder 300 senses it. That is, if the release command is generated after all test mode operations have completed, the test mode release decoder 300 decodes the command data and generates the test mode release signal TMD. Then, a switching element within test mode controller 400 is switched so as to generate the test ending signal DIST. At the moment, the switching element is embodied by fuse. Thus, once the test ending signal DIST is generated, the signal is continuously maintained at its initial state. Consequently, the test mode decoder 200 can not output test commands because it is disabled, even if test commands are received, so that the semiconductor memory device s thereafter prevented from entering the test mode.

Figure 5:
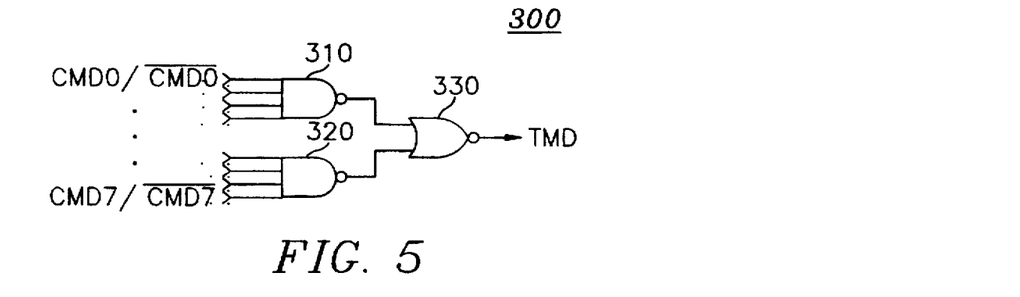
FIG. 5 is a circuit diagram illustrating one test release mode decoder among that shown in FIG. 3.

FIG. 5 is a diagram illustrating an embodiment of the test mode release decoder 300 according to the present invention. As shown in FIG. 5, NAND gates 310 and 320 decode the command date CMD for releasing the test mode. That is, the NAND gates 310 and 320 each generate signals set to the logic "low" level when the specific command to release the test mode is received. On the other hand, the NAND gates 310 and 320 generate signals set to the logic "high" level in all other states except the above one. A NOR gate 330 outputs a signal set to the logic "high" level when the NAND gates 310 and 320 output the signals set to the logic "low" level and on the contrary, it generates a signal set to the logic "low" level in all other states except the above one. Accordingly, the signal which is generated at the logic "high" level by the output of NOR gate 330 becomes the test mode release signal TMD and is also used for deactivating the test mode.

Figure 6:
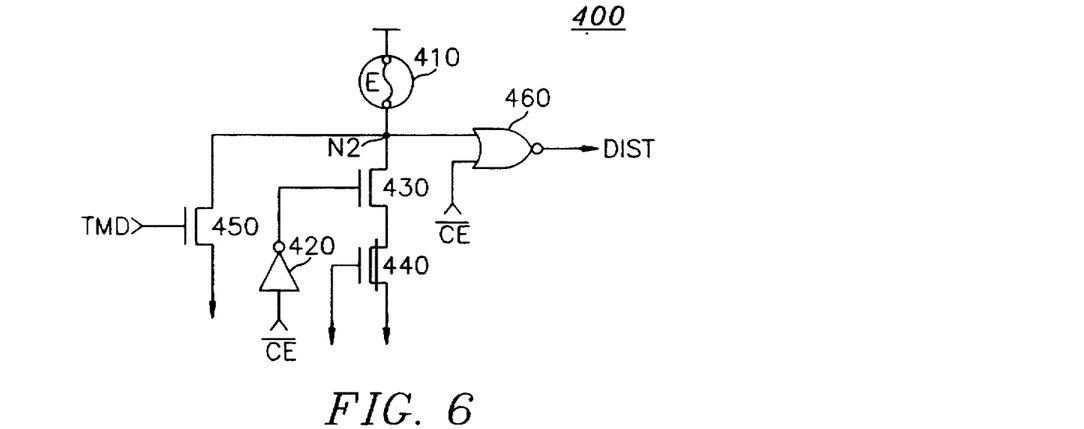
FIG. 6 is a diagram illustrating one test mode controller among that shown in FIG. 3.

FIG. 6 is a diagram illustrating an embodiment of the test mode controller 400 according to the present invention. As a switching element, the fuse 410 is connected between the power supply voltage and the node N2. The fuse of FIG. 6 is embodied by an electrical poly fuse, however, it can also be embodied by another fuse, for example of the type controlled by laser or a non volatile memory cell. Between node N2 and the ground voltage an NMOS transistor 430 and a depletion type NMOS transistor 440 are serially connected to each other. The NMOS transistor 430 has a gate electrode connected to an output terminal of an inverter which reverses a chip enable signal CE and the depletion type NMOS transistor 440 has a gate electrode connected to the ground voltage. An NMOS transistor 450 connected between node N2 and the ground voltage has a gate electrode coupled to the test mode release signal TMD. A NOR gate 460 to which the signal at node N2 and the chip enable signal CE are inputted generates the test ending signal DIST set to the logic "high" level when both of the two input signals are at the logic "low" level. On the other hand, NOR gate 460 generates a signal to activate the test mode when the output is set to a logic "low" level. Initially, when the test mode is in the activating state, as mentioned above, the test mode release signal TMD is set to the logic "low" level and the NMOS transistor 450 is turned off. NMOS transistor 450 is designed to have a big size so that it can cut the fuse by flowing a large amount current into a channel formed during a turn-on state. Fuse 410 is initially in an uncut state since the NMOS transistor 450 is initially turned off. Thereby, a current path is formed in node N2 by means of the power supply voltage. NMOS transistor 430 and depletion type transistor 440 are designed to have a channel resistance capable of generating a large amount voltage so that the NOR gate 460 can sense logic "high" when both are in the turn-on state. Thus, the gate electrode of the NMOS transistor 430 to which the chip enable signal CE reversed to the logic "high" level is inputted through the inverter 420 is maintained in the turn-on state. Likewise, the gate electrode of the depletion type NMOS transistor 440 to which the ground voltage is inputted is also maintained in the turn-on state. In this manner, the potential of the logic "high" level is always generated in the node N2. Hence, the NOR gate 460 generates a signal having the logic "low" level such that the test mode is activated, i.e., a state wherein the test mode release signal TMD has not yet been generated. However, after test mode is completed, when the test mode release signal TMD is generated at the logic "high" level, NMOS transistor 450 is turned on. The electric charge of the node N2 is rapidly discharged to the ground terminal through the NMOS transistor 450, so that a large amount current flows into the NMOS transistor 450 and the fuse 410 is cut. The potential of the node N2 is also discharged to the logic "low" level. Accordingly, both of the two inputs of the NOR gate 460 come to be at the logic "low" level and the NOR gate 460 generates the logic "high" test ending signal DIST for deactivating the test mode. The test ending signal DIST set to the logic "high" level is thereafter applied to the NOR gate 230 of the test mode decoder 200 shown in FIG. 4. In other words, if the test ending signal DIST is generated, test mode operations are thereafter prevented because test mode decoder 200 is disabled.

Accordingly, after test mode has completed, all of the command data CMD inputs become the user's. Consequently, the user mode decoder 500 is driven by all command data inputs and the corresponding user decoder generates the associated user mode selection signal UMS. In other words, only those decoders capable of generating user mode selection signals are allowed to be selected after test mode has been released.

Figure 7:
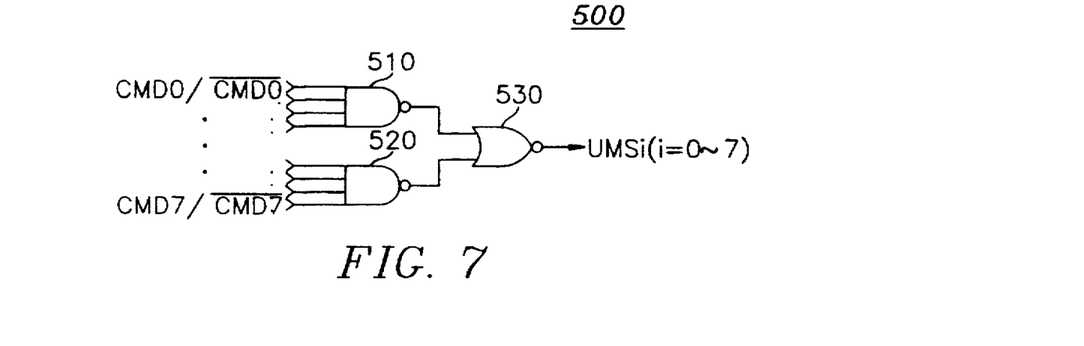
FIG. 7 is a diagram illustrating one user mode decoder among that shown in FIG. 3.

FIG. 7 is a diagram illustrating an embodiment of one user decoder in the user mode decoder 500. As shown above, the input buffer 100 outputs command data CMD of 8 bits. NAND gates 510 and 520 of 4 bits are used as decoders and have input terminals configured to respond to a specific user mode. So the user decoder shown in FIG. 7 is associated with the selected user mode and its input terminal is configured to respond to the corresponding user command. In the meantime, it is assumed that eight kinds of user modes UMS0–UMS7 are arranged in the present invention. Each of the NAND gates 510 and 520 generates signals set to the logic "low" level when the specific command data CMD of 4 bits for each gate in the user decoder is received. A NOR gate 530 receives the signals output from NAND gates 510 and 520. Thus, when the specific command associated with the user mode is received by the user decoder, the NOR gate 530 generates a signal set to the logic "high" level because it inputs two signals set to the logic "low" level. The generated signals correspond to user mode selection signals UMSi(i=0–7) output when the specific user decoder enables the corresponding user mode. However, if command data CMD not corresponding to the present specific user mode of the decoder is input, the NOR gate 530 of the user decoder outputs a signal set to the logic "low" level and the user mode is thus not performed.

The operation of the embodiment of FIGS. 3–7 can be summarized by the following <table 1>.

TABLE 1

|  | TMD N2 CE DIST | Remarks |
| --- | --- | --- |
| Test mode | L H L | user mode O.K., test mode O.K. |
| Test release mode | L H L L | |
| After test release mode | H L L L H | user mode O.K., test mode No |

The term "test mode" is a generic name for the operating mode which is capable of changing the feature of the chip in the semiconductor memory device, such as a redundant repair operation, and the term "user mode" is a generic name for the mode which is incapable of changing the feature of the chip, such as data read, write, and erase operations of data in the semiconductor memory device.

Figure 8:
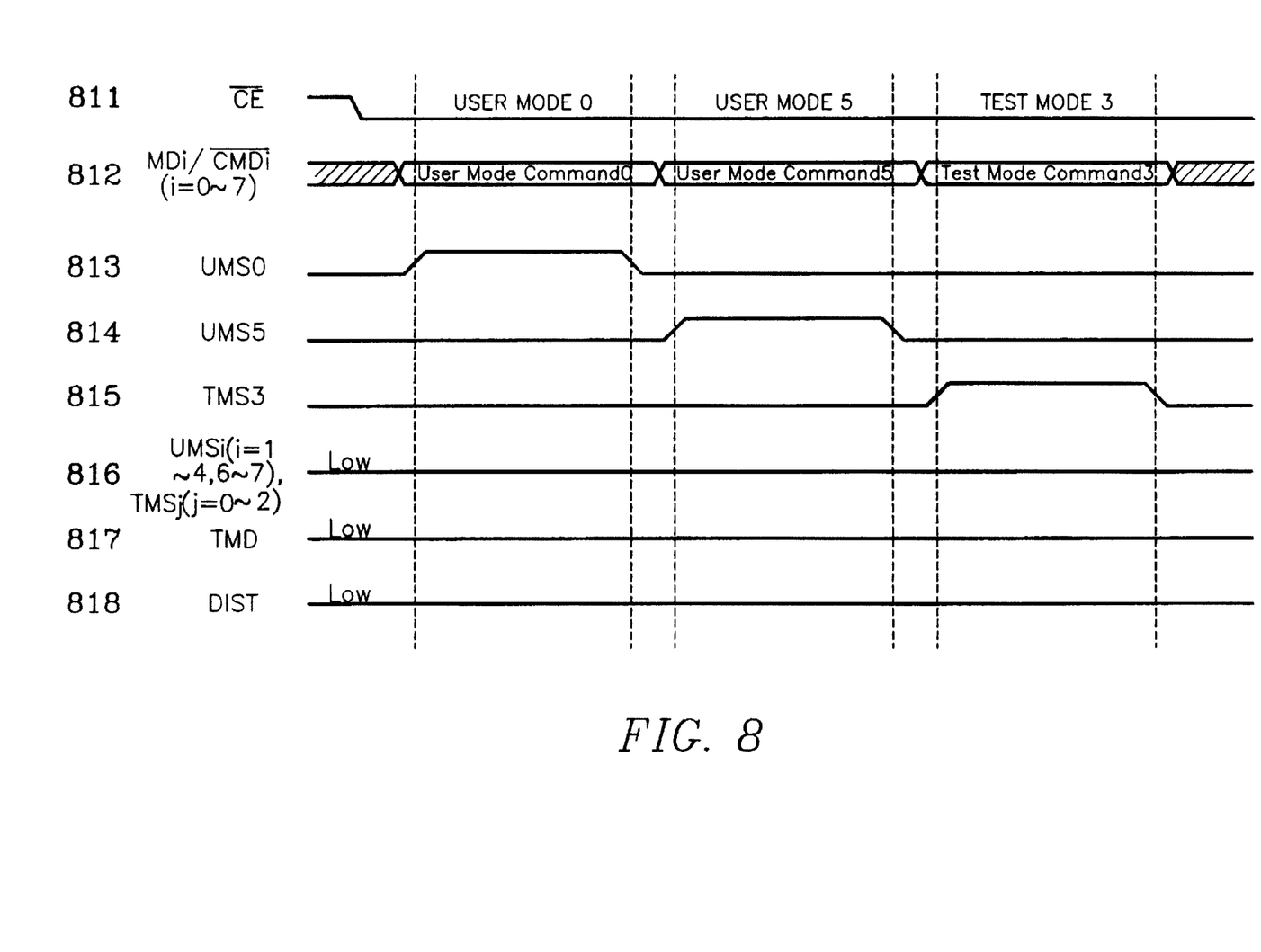
FIG. 8 is a timing diagram illustrating control of an operating mode before releasing test mode in FIGS. 3 to 7 according to the present invention.

FIG. 8 is a wave form illustrating the embodiment of FIGS. 3–7 wherein the test mode is enabled according to the operation of the present invention. As shown in FIG. 8, in operation, a chip enable signal 811 is outputted at the logic "low" level. NMOS transistor 430 in test mode controller 400 such as that shown in FIG. 6 is maintained in a turn-on state by means of the chip enable signal which is reversed to the logic "high" level through inverter 430. NOR gate 460 inputs the chip enable signal having a logic "low" level to one of its input terminals. At this time, because the test mode release command hasn't yet been received, the test mode release decoder 300 as shown in FIG. 5 generates, indicated by reference numeral 811, the test mode release signal TMD set to the logic "low" level. Accordingly, the test mode controller 400 generates, as shown in a reference numeral 818, the test ending signal DIST having the logic "low" level. In the above state, the test mode decoder 200 such as that shown in FIG. 4 and the user mode decoder 500 such as that shown in FIG. 7 each decode the received command data CMD and perform the corresponding test mode or the user mode. For illustration, it is assumed that the user mode 0, the user mode 5, and the test mode 3 are subsequently performed. First, when the command data CMD of the user mode 0 is required, the user decoder configured for user mode 0 written the user mode decoder 500 generates, as shown in a reference numeral 813, the user mode selection signal UMS0 set to the logic "high" level. Then, the command register 600 stores the user mode selection signal UMS0 and applies it to a controlled part. The controlled part (not shown) thereafter enables the user mode 0 in response the user mode selection signal UMS0. Next, when the command data CMD to perform user mode 5 is received, the corresponding user decoder within user mode decoder 500 generates, as shown in a reference numeral 814, the user mode selection signal UMS5 in the likewise manner as that described above. Finally, when the command data CMD of the test mode 3 is received, the test decoder configured for test mode 3 within test mode decoder 200 generates, as shown in a reference numeral 815, the test mode selection signal TMS3 at the logic "high" level. The command register 600, as mentioned above, stores the test mode selection signal TMS3 and applies it the controlled part. The controlled part subsequently performs the test mode corresponding to the test mode selection signal TMS3. Meanwhile, the decoding signals of the rest of user modes and test modes are maintained at the logic "low" level like 816 of FIG. 8. Hence, as shown in FIG. 8, all of the test and user modes can be performed when the test mode is enabled. Also, when it is necessary to change the feature of the chip or when it is necessary to repair a chip defect, the corresponding functions should be selected in the test mode. And, to perform read, write, and erase operations, the corresponding functions should be selected in the user mode.

Figure 9:
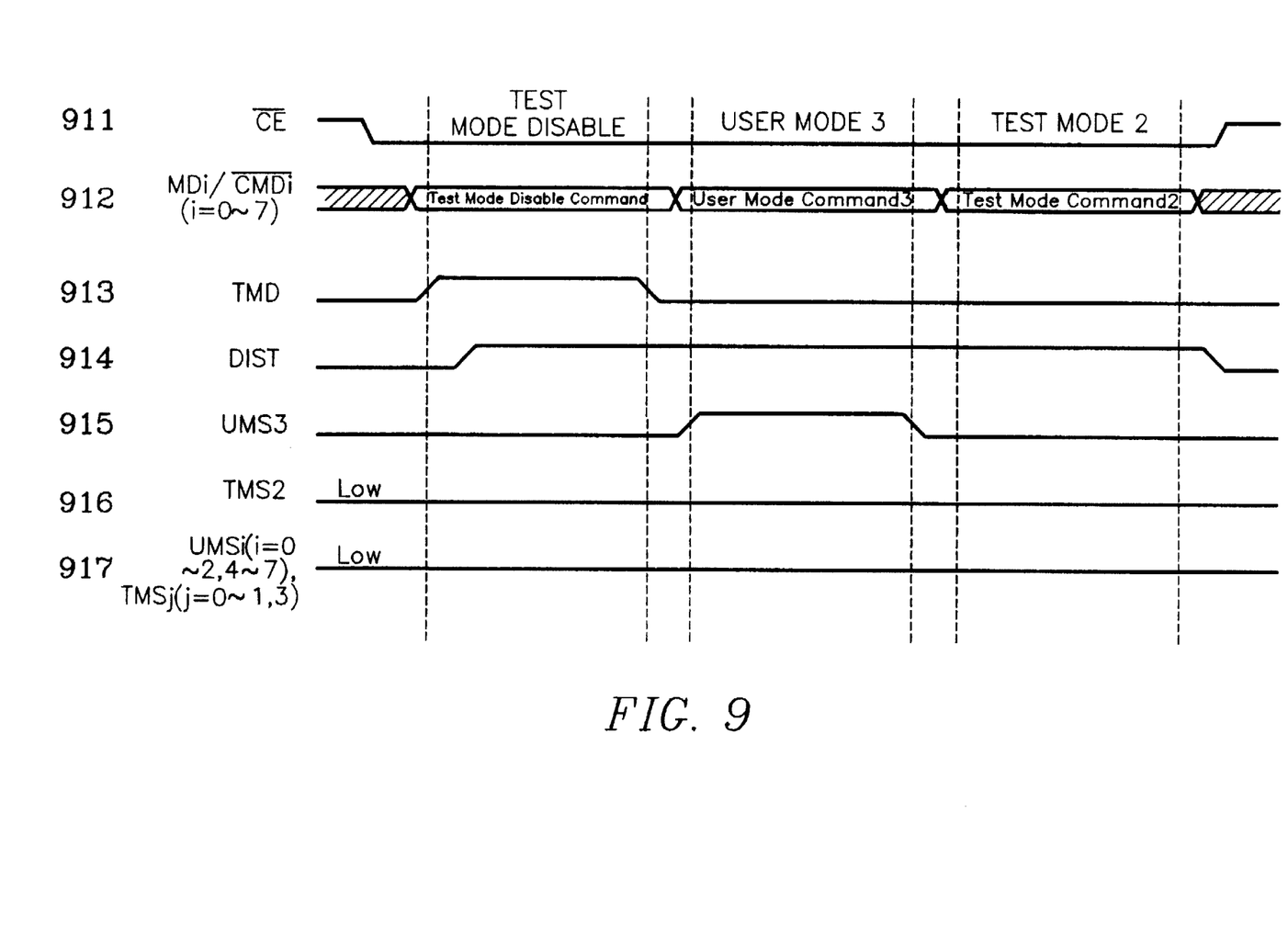
FIG. 9 is a timing diagram illustrating control of an operating mode after releasing test mode in FIGS. 3 to 7 according to the present invention.

After completion of the test mode, if it is unnecessary to perform any more test mode functions, entrance into test mode should be prevented by processing the test mode release command. FIG. 9 shows operation of the present invention after the test mode release command is received. When the test mode release command is received, the test mode release decoder 300 as shown in FIG. 5 generates the test mode release signal TMD set to the logic "high" level like 913 of FIG. 9. The NMOS transistor 450 of the test mode controller 400 as shown in FIG. 6 is turned on and the fuse 410 is thus cut. In addition, if the fuse 410 is cut, the potential of the node N2 is driven to the logic "low" level. Thereby, the test ending signal DIST is changed to the logic "high" level like 914 of FIG. 9. And, if the test ending signal DIST is generated at the logic "high" level, the NOR gate 230 of all the test decoders of the test mode decoder 200 as shown in FIG. 4 outputs a signal set to the logic "low" level. That is, if the test ending signal DIST set to the logic "high" level like 914 of FIG. 9 is generated, all of the test decoders of the test mode decoder 200 thereby discontinue performance of all test modes. Accordingly, it is impossible to perform the test mode any further. In other words, even if the test command to perform the test mode 2 is generated, for example, performance of the test mode 2 is prevented. Meanwhile, the user mode continues to be prosecuted as shown in FIG. 9. This means that only the user mode of the operating modes is performed when the test mode is disabled.

As discussed above, in the integrated circuit and the semiconductor memory device of the present invention, there is provided the advantage that a general user can be blocked from any possibility to enter the test mode or any other specific mode. Further, there is provided the additional advantage in that it is easy to select the test mode or the specific mode on command without having to apply a high voltage.

While the present invention has been described above with respect to the preferred embodiments, it will be appreciated by those in that art that these are set forth merely for purposes of example, and that the invention, or various aspects of the invention, may be advantageously used with other modifications or in other applications, without departing from the spirit and scope of the invention.

What is claimed is:

1. An operating mode controller for a semiconductor memory device having a user mode during which said semiconductor memory device performs user mode operations in response to user mode selection signals, and having a test mode during which said semiconductor memory device performs test mode operations in response to test mode selection signals, said operating mode controller comprising:

a user mode circuit for selectably supplying said user mode selection signals to said semiconductor memory device in accordance with user mode commands received from an external source;

a test mode circuit for selectably supplying said test mode selection signals to said semiconductor memory device in accordance with test mode commands received from said external source; and a fusable circuit which disables said test mode circuit from supplying said test mode selection signals to said semiconductor memory device after said test mode is performed even when said test mode commands are received from said external source.

2. An operating mode controller for a semiconductor memory device having a user mode during which said semiconductor memory device user mode operations in response to user mode selection signals, and having a test mode during which said semiconductor memory device performs test mode operations in response to test mode selection signals, said operating mode controller comprising:

a user mode decoder for receiving user mode commands and for supplying corresponding ones of said user mode selection signals to said semiconductor memory device in response thereto;

a test mode decoder for receiving test mode commands;

a test mode release decoder for receiving a test mode release command; and a test mode controller for causing said test mode decoder to supply corresponding ones of said test mode selection signals to said semiconductor memory device during said test mode in response to said test mode commands, and for preventing said test mode decoder from supplying said test mode selection signals to said semiconductor memory device after said test mode release command is decoded by said test mode release decoder.

3. An operating mode controller as claimed in claim 2 further comprising a command buffer for receiving input commands from an external pad, said user mode decoder receiving said user mode commands from said input buffer, said test mode decoder receiving said test mode commands from said input buffer, and said test mode release decoder receiving said test mode release command from said input buffer.

4. An operating mode controller as claimed in claim 3, wherein said input commands, said user mode commands, said test mode commands and said test mode release command are each comprised of eight bits.

5. An operating mode controller as claimed in claim 3, wherein a test mode disable signal is generated by said test mode release decoder and received by said test mode controller when said test mode release decoder decodes said test mode release command, and a test ending signal is generated by said test mode controller and supplied to said test mode decoder, said test mode decoder being prevented from supplying said test mode selection signals in response to said test ending signal;

and wherein said test mode controller includes
a transistor controlled by said test mode disable signal;
a driver for supplying said test ending signal; and a switching element having a first switch state and a second switch state for controlling said driver, wherein
said switching element is controlled by said transistor,
said switching element causes said driver to supply said test ending signal when it is in said second switch state, and
said transistor causes said switching element to change from said first switch state to said second switch state when said test mode decoder generates said test mode disable signal.

6. An operating mode controller as claimed in claim 5, wherein said switching element is a fuse coupled between said transistor and a power supply voltage, and
wherein said transistor has a channel formed between said fuse and a ground voltage, and
wherein the current flowing through said channel when said test mode decoder generates said test mode disable signal exceeds a predetermined current threshold of said fuse.

7. An operating mode controller as claimed in claim 6, wherein said driver is comprised of a NOR gate having a first input coupled to a node whose potential level is controlled by said switching element and having a second input coupled to a chip enable signal supplied by an external source, wherein when said switching element is in said second switch state, and when said chip enable signal is supplied, said NOR gate outputs said test mode disable signal.

8. An operating mode controller as claimed in claim 4, wherein said user mode decoder includes at least one user decoder.

9. An operating mode controller as claimed in claim 8, wherein said user mode decoder comprises a number of user decoders corresponding to a number of user modes capable of being performed by said semiconductor memory device, each of said user decoders configured to generate a user mode selection signal corresponding to each of said user modes, respectively.

10. An operating mode controller as claimed in claim 9, wherein said user mode decoder comprises eight user decoders.

11. An operating mode controller as claimed in claim 9, wherein each of said user decoders includes at least two user decoding elements, a first user decoding element being configured to decode a lower four bits of said user mode commands, and a second user decoding element being configured to decode an upper four bits of said user mode commands.

12. An operating mode controller as claimed in claim 4, wherein said test mode decoder includes at least one test decoder.

13. An operating mode controller as claimed in claim 12, wherein said test mode decoder comprises a number of test decoders corresponding to a number of test modes capable of being performed by said semiconductor memory device, each of said test decoders configured to generate a test mode selection signal corresponding to each of said test modes, respectively.

14. An operating mode controller as claimed in claim 13, wherein said test mode decoder comprises five test decoders.

15. An operating mode controller as claimed in claim 13, wherein each of said test decoders includes at least two test decoding elements, a first test decoding element being configured to decode a lower four bits of said test mode commands, and a second test decoding element being configured to decode an upper four bits of said test mode commands.

16. A method of controlling an operating mode of a semiconductor memory device having a user mode and a test mode, comprising the steps of:

inputting a command;

decoding said command;

enabling a corresponding user mode operation if said command decoded in said decoding step is a user mode command;

checking a test mode state;

enabling a corresponding test mode operation if said command decoded in said decoding step is a test mode command and said test mode is activated;

preventing a corresponding test mode operation if said command decoded in said decoding step is a test mode command and said test mode is deactivated;

changing said test mode state to deactivated if said command decoded in said decoding step is a test mode release command.

\* \* \* \* \*